United States Patent [19]

Dydyk

[11] 4,287,605

[45] Sep. 1, 1981

[54] DIRECTIONAL FILTER FOR MIXERS, CONVERTERS AND THE LIKE

[75] Inventor: Michael Dydyk, Scottsdale, Ariz.

[73] Assignee: Motorola Inc., Schaumburg, Ill.

[21] Appl. No.: 58,236

[22] Filed: Jul. 16, 1979

[51] Int. Cl.³ .................... H04B 1/26; H01P 1/207; H01P 5/18

[52] U.S. Cl. .................... 455/330; 330/4.9; 333/110; 333/231

[58] Field of Search .............. 333/110, 111, 231, 233, 333/253, 113; 330/4.9; 455/325, 330

[56] References Cited

U.S. PATENT DOCUMENTS

| | | | |
|---|---|---|---|
| 3,042,883 | 7/1962 | Pannenborg et al. | 333/110 |
| 3,092,790 | 6/1963 | Leake et al. | 333/110 |
| 3,560,887 | 2/1971 | Napoli et al. | 333/110 |
| 4,061,990 | 12/1977 | Ueno | 333/110 |

OTHER PUBLICATIONS

Coale, *A Traveling-Wave Directional Filter*, IRE Transion MTT, Oct. 1956, pp. 256-260.

Primary Examiner—Paul L. Gensler
Attorney, Agent, or Firm—Eugene A. Parsons

[57] ABSTRACT

First and second directional couplers each having a primary arm, a through arm and two secondary arms with a resonant circuit constructed to include the two secondary arms of each directional coupler. The directional filter forms a four port device with signals of a first frequency being applied to the first port and coupled to the fourth port by the resonant circuit, and signals applied to the third port being conveyed directly to the first port. Signals other than those at the first frequency are not coupled between the first and fourth ports.

9 Claims, 8 Drawing Figures

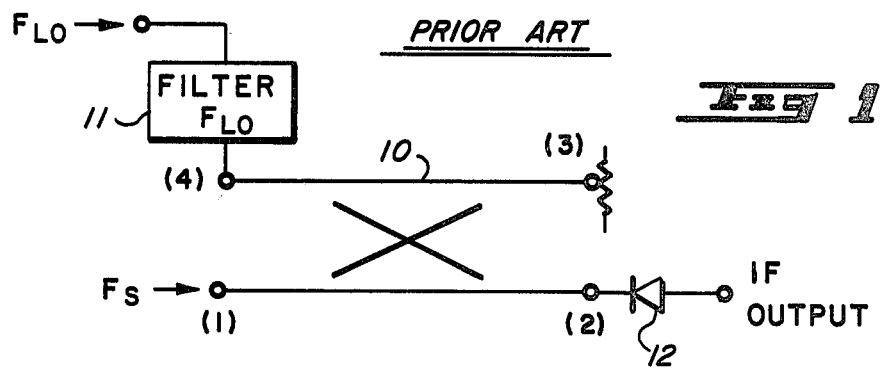
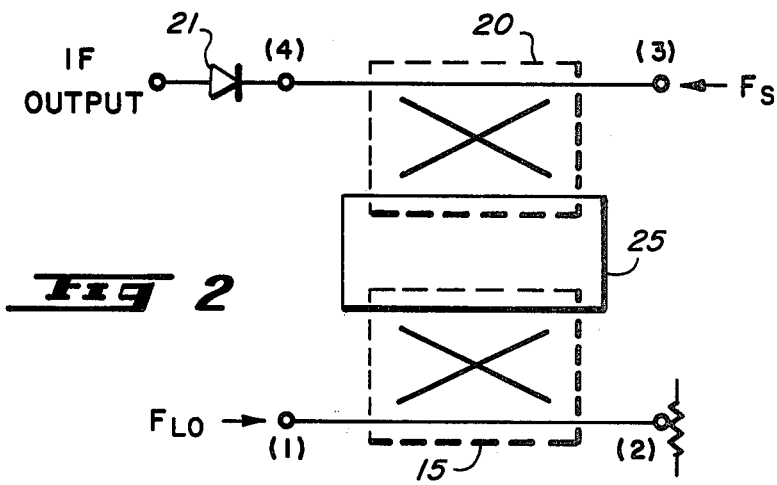
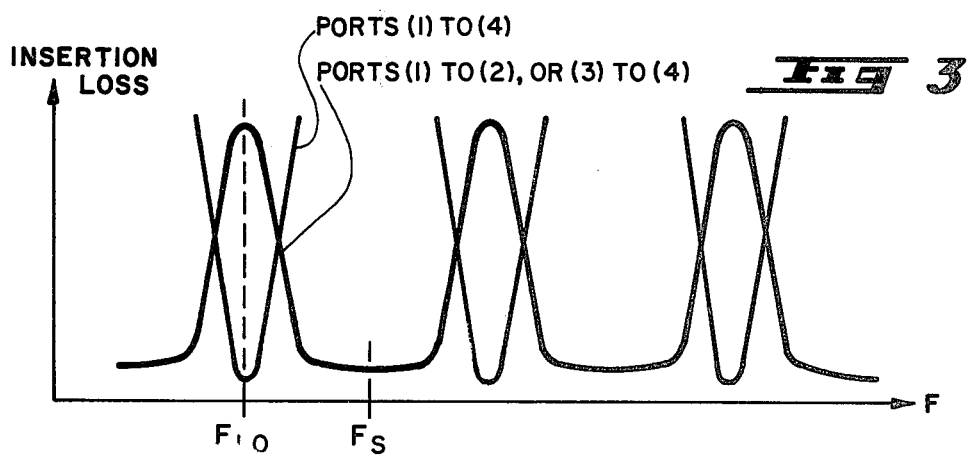

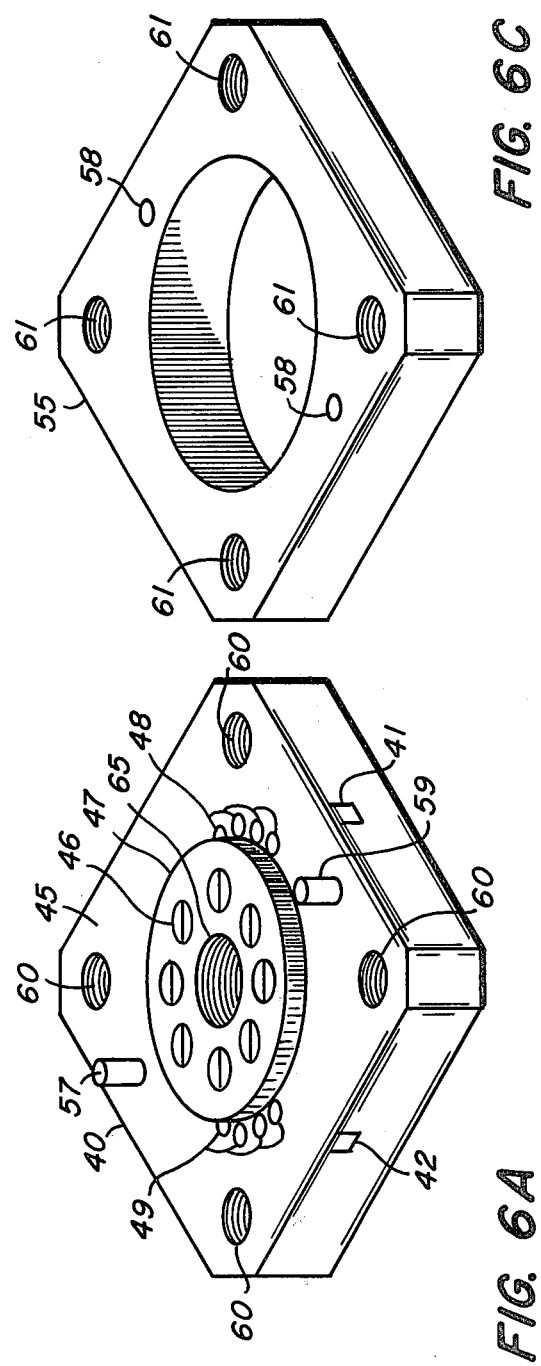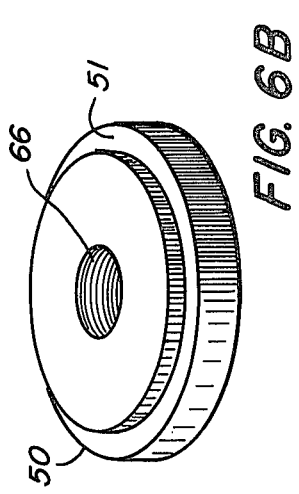
FIG. 6A
FIG. 6B
FIG. 6C

DIRECTIONAL FILTER FOR MIXERS, CONVERTERS AND THE LIKE

BACKGROUND OF THE INVENTION

This invention relates to a novel realization of a single ended mixer/up-converter with the performance comparable and exceeding in some characteristics that of a balanced configuration.

The balanced approach has the drawback of requiring two mixer diodes which increases the cost, size and local oscillator power requirements. However, frequently all of these factors are overlooked because the balanced arrangement has an inherent advantage of local oscillator noise cancellation. Another viable approach to noise reduction and utilization of one mixer diode is filtering, i.e., introducing a filter in the local oscillator branch of the mixer with appropriate preselection. This approach, in the past, has not been very attractive since the local oscillator power requirement is considerably greater than for the balanced arrangement. The power requirement is greater because of losses due to filter and coupler, where the coupler (usually at least 10 db) is used for local oscillator to RF isolation. This will be discussed further in conjunction with FIG. 1.

SUMMARY OF THE INVENTION

The present invention pertains to a directional filter including first and second directional couplers each having a primary arm, a through arm and two secondary arms and a resonant circuit constructed to include the two secondary arms of each directional coupler. The resonant circuit is tuned to couple only signals of a first frequency from a first port of the directional filter to a fourth port with signals applied to a third port of the directional filter being connected directly to the fourth port and isolated from the first port by the resonant circuit. In one embodiment a diode is connected to the fourth port to mix the signals from the first and third ports and provide, for example, an IF frequency.

In a second embodiment signals of a first frequency are applied through the diode to the fourth port, signals of a second frequency are applied to the third port and the resonant circuit is tuned to a third frequency, which is a mixture of the first two frequencies (e.g. an up-conversion), which third frequency is the only one available at the first port.

It is an object of the present invention to provide a new and improved directional filter.

It is a further object of the present invention to provide a new and improved directional filter for use in mixers or up-converters.

It is a further object of the present invention to provide a new and improved directional filter which requires less local oscillator power than prior art structures, provides higher isolation between inputs and provides the ability to achieve this superior performance over a wide frequency range by a single mechanical adjustment.

These and other objects of this invention will become apparent to those skilled in the art upon consideration of the accompanying specification, claims and drawings.

BRIEF DESCRIPTION OF THE DRAWINGS

Referring to the drawings, wherein like characters indicate like parts throughout the Figures:

FIG. 1 is a schematic illustration of a prior art structure;

FIG. 2 is a schematic illustration of a directional filter embodying the present invention;

FIG. 3 is a graphic representation of the frequency response of the directional filter illustrated in FIG. 2;

FIGS. 6A, 6B and 6C are an unassembled view of various parts of a directional filter embodying the present invention.

DESCRIPTION OF THE PREFERRED EMBODIMENT

Figure 4:
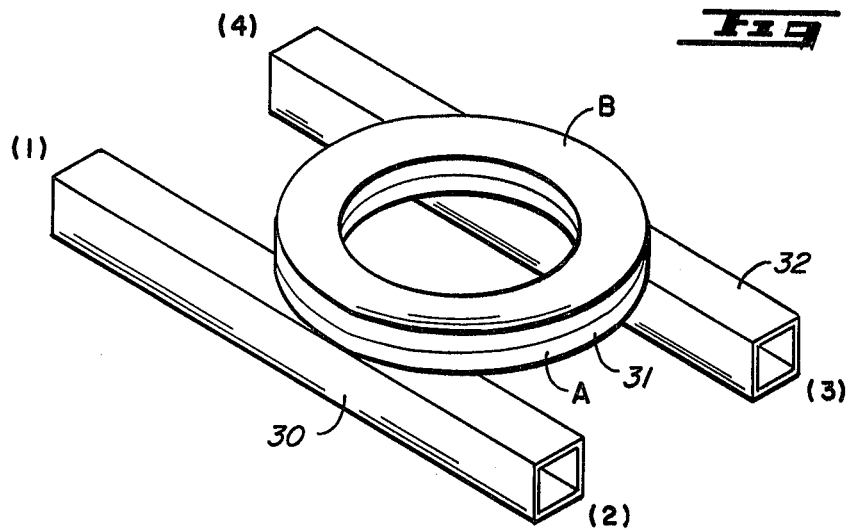
FIG. 4 is a view in perspective of a directional filter formed of waveguide and incorporating the present invention.

Referring specifically to FIG. 1 a prior art mixer is illustrated. The prior art mixer of FIG. 1 includes a four port directional coupler 10, a filter 11 and a diode 12. The four ports of the coupler 10 are numbered (1) through (4), starting with the lower left port of the coupler and numbering the ports in a counter-clockwise direction. Typically, the RF signal is applied to the mixer through port (1) of the coupler 10 and the diode 12 is connected to port (2) with the IF output being developed at the output terminal of the diode 12. Port (3) is unused and will, therefore, be terminated in a characteristic impedance. A signal from a local oscillator is applied to the input of the filter 11, the output of which is connected to port (4) of the coupler 10. A local oscillator generally includes much additional and unwanted noise and the filter 11, which is tuned to the desired local oscillator frequency ($f_{LO}$) is incorporated to remove all extraneous noise and insure that only the desired local oscillator frequency ($f_{LO}$) reaches port (4) of the coupler 10. Typically the directional coupler 10 will be a 10 db coupler, which means that one tenth of the local oscillator signal applied to port (4) will be coupled to port (2). Therefore, for the local oscillator signal and the RF signal to be approximately equal at port (2) the local oscillator signal must be approximately ten times as great as the RF signal. Thus, it can be seen that the power requirement for the local oscillator is considerable due to losses in the filter 11 and the coupler 10.

Referring specifically to FIG. 2, an improved directional filter embodying the present invention is illustrated. This improved directional filter includes a first directional coupler 15, a second directional coupler 20 and a diode 21. The directional filter is a four port device with the ports being numbered (1) through (4), starting with the lower left port and numbering the ports counter-clockwise. To prevent confusion in this explanation the various ports of the directional couplers 15 and 20 will not be numbered and instead the components of each directional coupler will be referred to as a primary arm, a through arm and two secondary arms. The primary arm of coupler 15 is connected to, or forms, port (1) of the directional filter. The through arm of coupler 15 is connected to, or forms, port (2) of the directional filter. The primary arm of the directional coupler 20 is connected to, or forms, port (3) of the directional filter and the through arm of the coupler 20 is connected to, or forms, port (4) of the directional filter. The secondary arms of the directional couplers 15 and 20 are connected together in a loop 25. The diode 21 is connected to the fourth port of the directional filter.

To connect the directional filter in a mixer configuration, for example, a local oscillator is connected to port (1) of the directional filter and the RF signal is connected to port (3). The loop 25 is made several wavelengths long and tuned to the local oscillator frequency ($f_{LO}$). Because the loop 25 is several wavelengths long the response becomes periodic, as illustrated in FIG. 3. As illustrated in FIG. 3, the loop 25 is designed so that a resonant peak occurs at the frequency, $F_{LO}$, of the local oscillator and all of the energy from the local oscillator between ports 1 and 2 is coupled from port (1) of the directional filter to port (4). Further, the loop 25 is designed so that minimum insertion loss is presented to the RF signal applied to port (3) so that all of the RF signal passes directly through the coupler 20 to port (4). Thus, the couplers 15 and 20 with the resonant loop 25 connected therebetween operates as a bandpass filter with an unloaded Q equal to the Q of the transmission line (assuming the couplers 15 and 20 and the resonant loop 25 are formed of a single type of transmission line), and a loaded Q dependent upon the coupling coefficients of the directional couplers 15 and 20. At resonance the through arm of the directional coupler 15 (port (1) to port (2) of the directional filter) behaves as a band rejection filter. The length of the loop 25 is the single factor which determines the position of the local oscillator frequency and the RF frequency relative to the response curve (as shown in FIG. 3). The length of the loop 25 which provides the required response is obtained from the following formula:

$$L = \frac{\lambda_{gLO}/2}{1 \pm \frac{\lambda_{gLO}}{\lambda_{gRF}}}$$

Thus, with the proper length of loop 25 the directional filter provides low loss filtering for the local oscillator signal (port (1) to port (4)), minimum loss for the RF signal (port (3) to port (4)) and high isolation between the local oscillator and RF signals (port (1) to port (3)).

In a slightly modified application of the directional filter illustrated in FIG. 2, the apparatus is utilized as an up-converter. In this application an RF signal is applied to port (3), as shown, but an IF signal is applied to the diode 21 at port 4, rather than being received at the output of the diode 21. The diode 21 again operates as a mixer to provide signals in the coupler 20 which are at a frequency equivalent to the sum and difference of the IF and RF signals applied to ports (4) and (3), respectively. The loop 25 must then be tuned so that it is resonant at the desired combination of the two signals (sum or difference) and the selected signal will then be available at port (1), which operates as an output. In this embodiment, port (2) is again terminated in the characteristic impedance but there is very little loss of energy at this port. It is believed that other applications in addition to the mixing and converting applications described may be devised by those skilled in the art, and it should be understood that the applications described are simply for purposes of explanation and should not be interpreted as limiting the present invention.

FIG. 4 illustrates a specific embodiment of the directional filter wherein the transmission lines forming the directional couplers are waveguide. The first directional coupler of the filter includes a straight section of waveguide 30 and a portion of a circular piece of waveguide 31. The primary and through arms of the coupler (port (1) and port (2)) are defined by the straight piece of waveguide 30 and the secondary arms form the portion of the circular waveguide 31. In a similar fashion, the second directional coupler includes a straight piece of waveguide 32 and a diametrically opposed portion of the circular waveguide 31. The straight section of waveguide 32 forms the primary and through arms (port (3) and port (4)) of the second directional coupler and the section of circular waveguide 31 forms the secondary arms.

Figure 5:
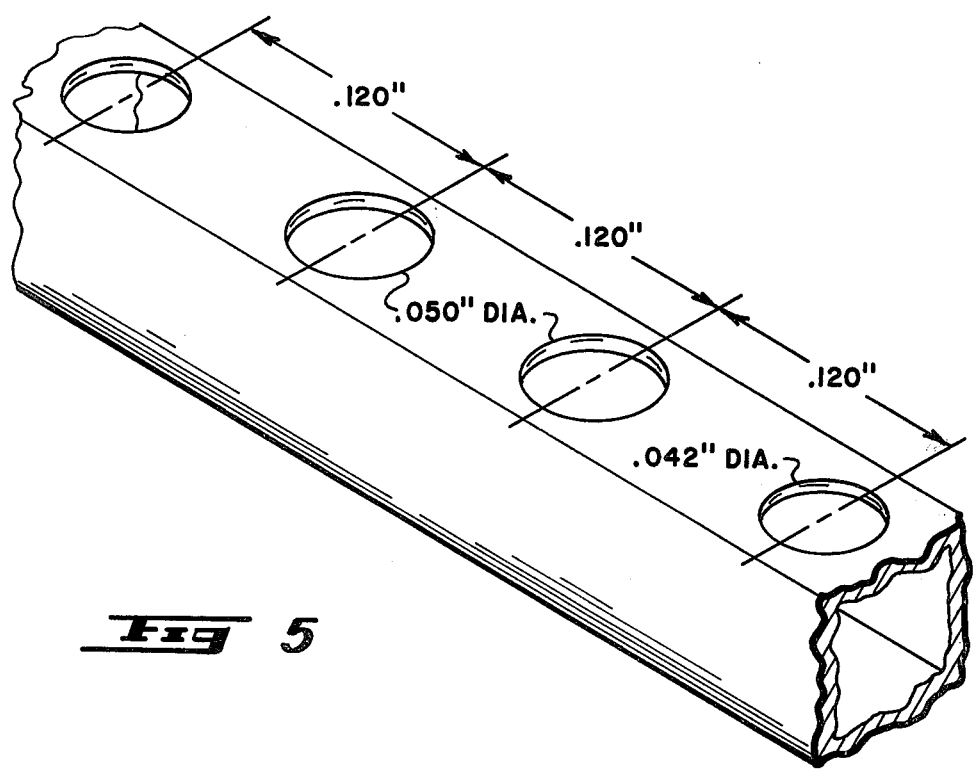
FIG. 5 is an enlarged view of the aperture pattern in the waveguide forming a portion of the directional coupler or FIG. 4.

There are many types of coupling apertures which can be utilized for coupling the straight sections of waveguide 30 and 32 to the circular waveguide 31 but it has been found that round coupling apertures yield simple and excellent results when applied to a practical multi-element array or combination of arrays. Further, while it is possible to locate the apertures in either the narrow or broad walls of the waveguide, the narrow wall is utilized in this embodiment to permit operating frequency and/or phase adjustment as will be described presently. Referring to FIG. 5, the specific aperture array utilized in the present embodiment is illustrated. This specific array was selected because of its broad band characteristics. Further, it was found that separating the apertures by the standard quarter wavelength limits the maximum diameter of the aperture and, therefore, reduces the coupling available. The apertures, in this embodiment, are separated by a distance equal to three-fourths of a wavelength of the characteristic frequency of the waveguide. With this separation between apertures the coupler still retains adequate bandwidth while permitting aperture diameter to increase to the full size of the waveguide narrow wall. This specific design yields approximately a 10 db coupler. It should be understood that this specific coupling arrangement is illustrated for example only and many other coupling arrangements may be devised by those skilled in the art.

In general, it is desirable to use up-converters and the like over a band of frequencies. Further, the characteristic frequency and, hence, the wavelength of the characteristic frequency of the waveguide varies in accordance with the following equation:

$$\lambda_g = \frac{\lambda_o}{\sqrt{1 - \left(\frac{\lambda_o}{2a}\right)^2}}$$

where "a" equals the width of the broad wall of the waveguide. In the embodiment illustrated in FIG. 4, the apparatus is made adjustable over a desired bandwidth by forming the circular waveguide in two halves, A and B. The lower section A of the circular waveguide 31 is fixedly connected to the waveguide sections 30 and 32 and the upper section is adjustable to vary the gap between the sections A and B and, therefore, to change the characteristic wavelength thereof. At very high frequencies, e.g. 90 gigahertz, this gap will be very small so that there is no substantial power leakage and adjustment over the entire desired bandwidth is produced by a very small change in the gap. It will of course be understood by those skilled in the art that adjustments can be made with other transmission lines, such as coax, twin lead, microstrip, stripline, etc., and that the present waveguide embodiment and adjustment feature are illustrated for explanation only.

FIGS. 6A, 6B and 6C illustrate in detail apparatus embodying the concepts explained in conjunction with the apparatus of FIG. 4. A generally rectangularly shaped base member 40 has two generally arcuately shaped elongated grooves 41 and 42 formed therein with generally rectangular shaped cross sections to form the through pieces of the couplers (comparable to waveguide sections 30 and 32 of FIG. 4). A flat plate 45 is affixed to the upper surface of the base 40 by means of screws 46, which plate forms the upper wall for the waveguides 41 and 42. In addition, an edge 47 is formed in the upper surface of the plate 45 and serves as the lower half of the circular section of waveguide (comparable to 31A of FIG. 4) Coupling apertures 48 couple the circular waveguide section 47 to the waveguide 41 and apertures 49 couple the circular section 47 to the waveguide 42. A circular block 50 has a circular edge 51 formed in one flat surface thereof, which circular edge 51 mates with the circular edge 47 and the inner periphery of a block 55 to form the circular waveguide of the directional filter. The block 50 is held in place by means of the rectangular block 55 having the central opening therethrough constructed to receive the circular block 50 therein. Two alignment pegs 57 and 59 are fixedly engaged in an upright position in the upper surface of the base member 40 so as to align the plate 45 and the rectangular block 55. The block 55 has openings 58 therein designed to receive the alignment pegs 57 and 59 for assembly purposes. Further, an opening 60 through the base member 40 and plate 45 is provided in each of the corners in alignment with threaded openings 61 in each of the corners of the rectangular block 55. Bolts (not shown) are inserted through the opening 60 and threadly engaged in the opening 61 to hold the entire assembly together. A central opening 65 through the base member 40 and plate 45 is in alignment with a threaded opening 66 through the circular block 50. A bolt inserted through the opening 65 and threadly engaged in the opening 66 serves as a mechanical adjustment for positioning the circular block 50 relative to the plate 45 so as to adjust the gap therebetween and, hence, the characteristic wavelength of the waveguide formed thereby.

Thus, an improved directional filter, which is especially useful as a mixer and/or an up-converter, is disclosed. The mixer thus formed is a single mixer diode capable of achieving noise figures comparable with a balanced configuration. Further, the improved directional filter provides substantially lower insertion loss in the local oscillator circuit, and therefore, requires less local oscillator drive power than any prior art structures, including the balanced configuration. In addition, the improved directional filter has a higher local oscillator to RF signal input isolation and the ability to achieve this superior performance over a wide frequency range by a single mechanical adjustment. In the up-converter application the improved directional filter provides a lower overall conversion loss. While I have shown and described a specific embodiment of this invention, further modifications and improvements will occur to those skilled in the art. I desire it to be understood, therefore, that this invention is not limited to the particular form shown and I intend in the appended claims to cover all modifications which do not depart from the spirit and scope of the invention.

I claim:

1. A directional filter comprising:
   (a) a first transmission line having an input for signals of a first frequency, $f_1$;
   (b) a second transmission line having an input for signals of a second frequency, $f_2$, and an output; and
   (c) coupling means formed of a third transmission line in a closed loop of a length determined by $$L = \frac{\lambda_{g/1}/2}{1 \pm \frac{\lambda_{g/1}}{\lambda_{g/2}}}$$

coupled to said first and second transmission lines and tuned to provide substantially maximum coupling of the first frequency signals from the first to the second transmission lines and substantially minimum coupling of the second frequency signals from the second to the first transmission lines.

2. A directional filter as claimed in claim 1 having in addition a diode connected to the output of the second transmission line for mixing the signals of the first and second frequencies.

3. A directional filter as claimed in claim 1 wherein the coupling means includes tuning means for adjusting the frequencies at which the maximum and minimum coupling occurs.

4. A directional filter as claimed in claim 3 wherein the first, second and third transmission lines are waveguide.

5. A directional filter as claimed in claim 4 wherein the first and third and the second and third transmission lines each have parallel, juxtapositioned walls with a plurality of openings therethrough to provide coupling.

6. A directional filter as claimed in claim 5 wherein the waveguide forming the third transmission line has first parallel sides with a major dimension and second parallel sides with a minor dimension, the tuning means including longitudinally extending gaps in the first parallel sides and apparatus for varying the width of the gaps to vary the major dimensions of the first parallel sides.

7. A directional filter as claimed in claim 6 wherein the plurality of openings are formed in one of the second parallel sides.

8. A directional filter as claimed in claim 5 wherein the plurality of openings are circular.

9. A directional filter as claimed in claim 5 wherein adjacent openings are spaced apart approximately three fourths of a wavelength of the characteristic frequency of the third transmission line.

* * * * *